(12) United States Patent
Morosawa et al.

(10) Patent No.: US 8,389,991 B2
(45) Date of Patent: Mar. 5, 2013

(54) THIN FILM TRANSISTOR, DISPLAY DEVICE, AND ELECTRONIC DEVICE

(75) Inventors: Narihiro Morosawa, Kanagawa (JP); Eri Fukumoto, Kanagawa (JP); Yasuhiro Terai, Kanagawa (JP)

(73) Assignee: Sony Corporation, Tokyo (JP)

( * ) Notice: Subject to any disclaimer, the term of this patent is extended or adjusted under 35 U.S.C. 154(b) by 76 days.

(21) Appl. No.: 12/951,683

(22) Filed: Nov. 22, 2010

(65) Prior Publication Data
US 2011/0140116 A1    Jun. 16, 2011

(30) Foreign Application Priority Data
Dec. 1, 2009    (JP) ................. P2009-273801

(51) Int. Cl.
*H01L 29/04*    (2006.01)
*H01L 31/20*    (2006.01)
*H01L 31/036*    (2006.01)
*H01L 31/0376*    (2006.01)

(52) U.S. Cl. ............. 257/59; 257/43; 257/57; 438/104; 438/158

(58) Field of Classification Search ............ 257/43, 257/57, 59, E29.273; 438/104, 158
See application file for complete search history.

(56) References Cited

U.S. PATENT DOCUMENTS

| | | | |
|---|---|---|---|
| 5,965,918 A * | 10/1999 | Ono | 257/347 |
| 2007/0194379 A1 | 8/2007 | Hosono et al. | |
| 2009/0184315 A1* | 7/2009 | Lee et al. | 257/43 |
| 2010/0025675 A1* | 2/2010 | Yamazaki et al. | 257/43 |
| 2010/0102313 A1* | 4/2010 | Miyairi et al. | 257/43 |
| 2011/0163309 A1* | 7/2011 | Choi et al. | 257/43 |
| 2011/0175080 A1* | 7/2011 | Kim et al. | 257/43 |

FOREIGN PATENT DOCUMENTS
JP    2007-194594    8/2007
WO    2005/088726    9/2005

OTHER PUBLICATIONS

Cetin Kilic and Alex Zunger; n-type doping of oxides by hydrogen; Applied Physics Letters; vol. 81, No. 1; Jul. 1, 2002.

* cited by examiner

*Primary Examiner* — Phuc Dang
(74) *Attorney, Agent, or Firm* — SNR Denton US LLP

(57)    ABSTRACT

The present invention provides a thin film transistor using an oxide semiconductor as a channel, controlling threshold voltage to a positive direction, and realizing improved reliability. The thin film transistor includes: a gate electrode; a pair of source/drain electrodes; an oxide semiconductor layer provided between the gate electrode and the pair of source/drain electrodes and forming a channel; a first insulating film as a gate insulating film provided on the gate electrode side of the oxide semiconductor layer; and a second insulating film provided on the pair of source/drain electrodes side of the oxide semiconductor layer. The first insulating film and/or the second insulating film contain/contains fluorine.

16 Claims, 10 Drawing Sheets

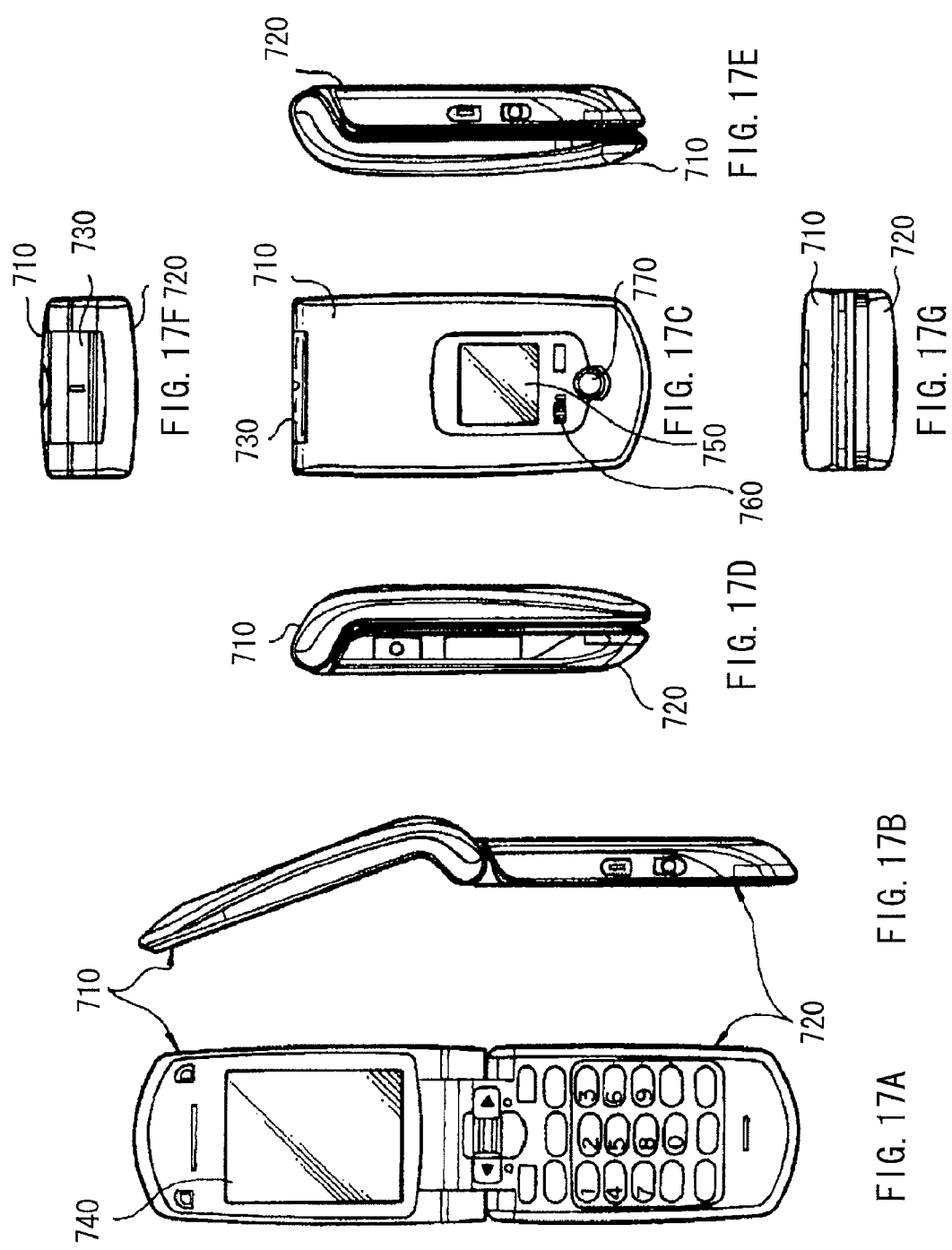

THIN FILM TRANSISTOR, DISPLAY DEVICE, AND ELECTRONIC DEVICE

BACKGROUND OF THE INVENTION

1. Field of the Invention

The present invention relates to a thin film transistor using an oxide semiconductor for a channel layer, and a display device and an electronic device each using the thin film transistor.

2. Description of the Related Art

In recent years, with the aim of application of a thin film transistor (TFT), a light emitting device, a transparent conductive film, and the like to electronic devices, research and development on oxide semiconductors such as zinc oxide and indium gallium zinc oxide is actively performed. It is known that, in the case of using such oxide semiconductor to an active layer (channel) of a TFT, as compared with the case of using amorphous silicon which is generally used for a liquid crystal display or the like, the electron mobility is higher, and more excellent electric characteristics are displayed. There are also advantages such that the high mobility is expected even at a low temperature around the room temperature, so that the oxide semiconductor is positively developed. A TFT using such an oxide semiconductor layer of a bottom-gate type and that of a top-gate type are reported (see, for example, WO2005-088726).

A bottom-gate-type TFT having a structure that, for example, a gate electrode is provided on a substrate, and a thin film layer of oxide semiconductor is formed over the gate electrode with a gate insulating film in between is known (see, for example, Japanese Unexamined Patent Application Publication No. 2007-194594). The structure is similar to a bottom-gate-type TFT structure using amorphous silicon for the channel which is presently commercially used. Consequently, at the time of manufacturing a TFT of oxide semiconductor, an existing TFT manufacturing process using amorphous silicon may be easily used. A TFT using the oxide semiconductor for the channel is being commercially available.

SUMMARY OF THE INVENTION

It is also known that heat resistance of the oxide semiconductor is insufficient, and oxygen, zinc, and the like are separated by heat treatment in a TFT manufacturing process, and a lattice defect is caused. The lattice defect makes electrically shallow impurity level, and causes lower resistance of an oxide semiconductor layer. Consequently, in the case of using the oxide semiconductor for a channel of a TFT, a normally-on-type, that is, a depletion-type operation in which drain current flows without applying gate voltage is performed. A defect level increases, the threshold voltage decreases, and leak current increases. In addition to the lattice defect, it is also known that an impurity level similar to the above is obtained due to mix-in of an element such as hydrogen (see, for example, Cetin Kilic et al., "n-type doping of oxides by hydrogen", APPLIED PHYSICS LETTERS, No. 1, Vol. 81, Jul. 1, 2002, pp. 73-75).

There is consequently a disadvantage that the transmission characteristics of a TFT fluctuate in a manufacturing process and the like, and the threshold voltage shifts in a negative (−(minus)) direction.

For example, in the case of forming an n-type channel by using oxide semiconductor, the electron concentration in the channel becomes high and, as a result, the threshold voltage tends to become a negative value. In a TFT using the oxide semiconductor, since it is difficult to form a p-type channel, a circuit has to be formed only by an n-type TFT. In such a case, when the threshold voltage becomes a negative value, the circuit configuration becomes complicated and it is undesirable.

In particular, in the case of employing a TFT using the oxide semiconductor for a channel to a drive circuit such as an organic EL display, a liquid crystal display, an electronic paper, or the like, high reliability is requested for the TFT. In the TFT using the oxide semiconductor, however, a technique for sufficiently improving reliability is not established.

It is therefore desirable to provide a thin film transistor using oxide semiconductor for a channel, controlling threshold voltage to a positive direction, and realizing increased reliability, and a display device and electronic device each using the thin film transistor.

A thin film transistor of an embodiment of the present invention includes: a gate electrode; a pair of source/drain electrodes; an oxide semiconductor layer provided between the gate electrode and the pair of source/drain electrodes and forming a channel; a first insulating film as a gate insulating film provided on the gate electrode side of the oxide semiconductor layer; and a second insulating film provided on the pair of source/drain electrodes side of the oxide semiconductor layer. The first insulating film and/or the second insulating film contain/contains fluorine (F).

A display device of an embodiment of the present invention includes a display element and the above-mentioned thin film transistor of an embodiment of the invention.

Electronic device of an embodiment of the invention includes a display device having a display element and the above-mentioned thin film transistor of an embodiment of the invention.

In the thin film transistor of an embodiment of the invention, the first insulating film (gate insulating film) is provided on the gate electrode side of the oxide semiconductor layer, the second insulating film is provided on the source/drain electrodes side, and the first insulating film and/or the second insulating film contain/contains fluorine. Since fluorine attracts negative (−) charges (electrons), a negative fixed charge is generated in the insulating film containing fluorine, and the insulating film is negatively charged. In the case where oxygen in the oxide semiconductor layer is separated in a manufacturing process or the like and a lattice defect occurs, the lattice defect is compensated by fluorine in the insulating film.

According to the thin film transistor of an embodiment of the invention, the first insulating film (gate insulating film) is provided on the gate electrode side of the oxide semiconductor layer, the second insulating film is provided on the source/drain electrodes side, and the first insulating film and/or the second insulating film contain/contains fluorine. With the configuration, a negative fixed charge is generated in the insulating film containing fluorine, and the threshold voltage is shifted to the positive direction by the negative fixed charge. Even in the case where a lattice defect occurs due to separation of oxygen in the oxide semiconductor layer, the lattice defect is compensated by fluorine. Thus, the electric characteristics of the oxide semiconductor are maintained stably. Therefore, the oxide semiconductor is used as a channel, the threshold voltage is controlled to the positive direction, and reliability is improved.

Other and further objects, features and advantages of the invention will appear more fully from the following description.

BRIEF DESCRIPTION OF THE DRAWINGS

FIG. 17A is a front view in an open state of application example 5, FIG. 17B is a side view in the open state, FIG. 17C is a front view in a closed state, FIG. 17D is a left side view, FIG. 17E is a right side view, FIG. 17F is a top view, and FIG. 17G is a bottom view.

DETAILED DESCRIPTION OF THE PREFERRED EMBODIMENTS

Embodiments of the present invention will be described in detail hereinbelow with reference to the drawings. The description will be given in the following order.
Bottom Gate Type TFT
1. first embodiment (example of forming a channel protection film containing fluorine by PCVD)
2. first modification (example in which a gate insulating film has a stack structure and a layer on the channel side contains fluorine)
3. second modification (example where the gate insulating film is doped with fluorine)
Top Gate Type TFT
4. second embodiment (example of forming a base coat film containing fluorine by PCVD)
5. third modification (example in which a gate insulating film has a stack structure and a layer on the channel side contains fluorine)
6. application example (example of a display device and electronic device)
First Embodiment
Configuration of Thin Film Transistor 1

Figure 1:
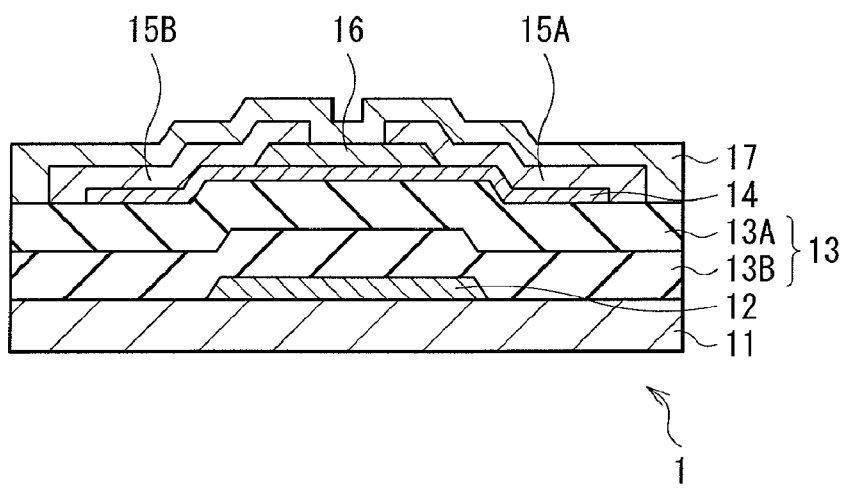
FIG. 1 illustrates a sectional structure of a thin film transistor according to a first embodiment of the present invention.

FIG. 1 illustrates a sectional structure of a thin film transistor 1 according to a first embodiment of the present invention. The thin film transistor 1 is a TFT of a so-called bottom-gate type (inverted staggered structure), in which oxide semiconductor is used for a channel (active layer). In the thin film transistor 1, a gate electrode 12, a gate insulating film 13, an oxide semiconductor layer 14, a channel protection film 16, and source/drain electrodes 15A and 15B are formed in this order on a substrate 11 made of glass or the like. On the source/drain electrodes 15A and 15B, a protection film 17 is formed on the entire face of the substrate 11. The gate insulating film 13 is a concrete example of a "first insulating film" of the invention, and the channel protection film 16 is a concrete example of a "second insulating film" of the invention.

The gate electrode 12 plays the role of controlling carrier density (in the embodiment, electron density) in the oxide semiconductor layer 14 by a gate voltage applied to the thin film transistor 1. The gate electrode 12 is a single-layer film made of one of molybdenum (Mo), aluminum (Al), aluminum alloy, and the like or a stack film made of two or more of the elements. An example of the aluminum alloy is an aluminum-neodymium alloy.

The gate insulating film 13 is a single-layer film made by one of a silicon oxide film, a silicon nitride film, a silicon nitride oxide film, an oxide aluminum film, and the like or a stack film made of two or more of the films. The gate insulating film 13 has a two-layer structure made of first and second insulating layers 13A and 13B. The first insulating layer 13A is, for example, a silicon oxide film, and the second insulating layer 13B is, for example, a silicon nitride film. The thickness of the gate insulating film 13 is, for example, 200 nm to 300 nm both inclusive.

The oxide semiconductor layer 14 contains, as a main component, an oxide of at least one of elements of indium (In), gallium (Ga), zinc (Zn), tin (Sn), aluminum, and titanium (Ti). The oxide semiconductor layer 14 is used to form a channel between the source/drain electrodes 15A and 15B by application of gate voltage. The thickness of the oxide semiconductor layer 14 is, for example, 5 nm to 100 nm both inclusive.

The source/drain electrodes 15A and 15B are, for example, a single-layer film made of one of molybdenum, aluminum, copper (Cu), titanium, ITO (Indium Tin Oxide), titanium oxide, and the like or a stack film made of two or more of the foregoing elements. It is preferable to use a three-layer film obtained by sequentially stacking molybdenum, aluminum, and molybdenum with thicknesses of 50 nm, 500 nm, and 50 nm, respectively, or a metal or metal compound having weak bonding to oxygen such as a metal compound containing oxygen such as ITO or titanium oxide. With the compound, the electric characteristics of the oxide semiconductor are stably held. On the other hand, since the source/drain electrodes 15A and 15B are formed in contact with the oxide semiconductor, in the case of making the source/drain electrodes 15A and 15B of a metal having strong bonding to oxygen, oxygen in the oxide semiconductor is extracted, an oxygen defect occurs, and the electric characteristics deteriorate.

The channel protection film 16 is formed on the oxide semiconductor layer 14, thereby preventing the channel from being damaged at the time of forming the source/drain electrodes 15A and 15B. In the embodiment, the channel protection film 16 is formed in contact with the oxide semiconductor layer 14 and is an insulating film containing fluorine (F). The channel protection film 16 is, for example, a silicon oxide film containing fluorine, in other words, an insulating film containing fluorine, silicon (Si), and oxygen (O). Preferably, fluorine concentration in the channel protection film 16 is $1 \times 10^{20}$ atom/cm$^3$ or higher. With the concentration, the threshold voltage of the thin film transistor 1 is allowed to be shifted in the positive direction by 1V or more. Further, in the channel protection film 16, preferably, hydrogen concentration is low. When hydrogen comes to be mixed in the oxide semiconductor layer 14, the hydrogen functions as a donor, and the electric characteristics change. Such a channel protection film 16 is formed by using plasma CVD (Chemical Vapor Deposition) which will be described later, and its thickness is, for example, 200 nm.

The protection film 17 is, for example, a single film such as an aluminum oxide film or a silicon oxide film or a stack film of an aluminum oxide film and a silicon oxide film. The thickness of the protection film 17 is, for example, 10 nm to 100 nm both inclusive and, preferably, 50 nm or less. The oxide semiconductor film has a drawback that its electric characteristics change due to mixture of hydrogen, absorption of moisture, or the like. By using the aluminum oxide film as the protection film 17, the influence of hydrogen or moisture is prevented by the excellent gas barrier property of the aluminum oxide film. By using the aluminum oxide film as the protection film 17, the protection film is allowed to be formed without deteriorating the electric characteristics of the oxide semiconductor.

Method of Manufacturing Thin Film Transistor 1

FIGS. 2A to 2C and FIGS. 3A to 3C are diagrams for explaining a method of manufacturing the thin film transistor 1. The thin film transistor 1 may be manufactured, for example, as follows.

Figure 2A:
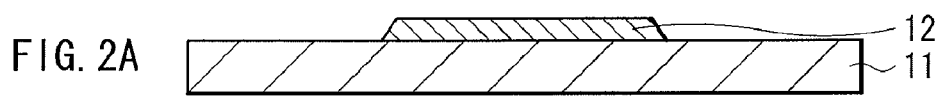
FIGS. 2A to 2C are diagrams illustrating a method of manufacturing a thin film transistor shown in FIG. 1 in the process order.

First, as illustrated in FIG. 2A, a metal thin film is formed on the entire surface of the substrate 11 by sputtering or deposition. After that, the metal thin film is patterned by using, for example, photolithography, thereby forming the gate electrode 12.

Figure 2B:
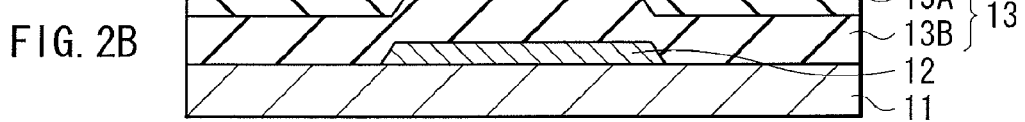

Subsequently, as illustrated in FIG. 2B, the second insulating film 13B and the first insulating film 13A are formed by in order by using, for example, plasma CVD so as to cover the substrate 11 and the gate electrode 12, thereby forming the gate insulating film 13. Concretely, first, by plasma CVD using a mixed gas containing silane (SiH$_4$), ammonia (NH$_3$), and nitrogen as a material gas, the second insulating film 13B of a silicon nitride film is formed. After that, by plasma CVD using a mixed gas containing silane and dinitrogen monoxide (N$_2$O) as a material gas, the first insulating film 13A of a silicon oxide film is formed.

Figure 2C:
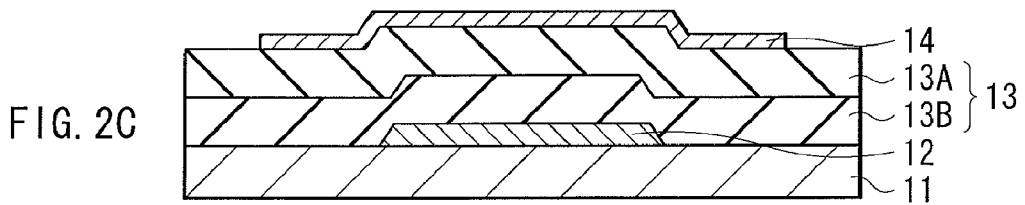

Subsequently, as illustrated in FIG. 2C, the oxide semiconductor layer 14 is formed by, for example, sputtering. Concretely, in the case of using indium gallium zinc oxide (IGZO) as an oxide semiconductor, DC sputtering using ceramic of IGZO as a target is performed. In this case, for example, in a DC sputtering apparatus, a vacuum vessel is evacuated so that the degree of vacuum becomes, for example, $1 \times 10^{-4}$ or less. After that, a mixture gas of argon (Ar) and oxygen is introduced to perform plasma discharge. The carrier concentration of the channel is controlled by adjusting the flow ratio of argon and oxygen in the mixed gas.

Alternately, in the case of using zinc oxide as an oxide semiconductor, it is sufficient to perform RF sputtering using ceramic of zinc oxide as a target or DC sputtering using zinc as a target in atmosphere of a mixed gas of argon and oxygen. After that, the oxide semiconductor layer 14 formed is patterned in a desired shape by using, for example, photolithography.

Figure 3A:
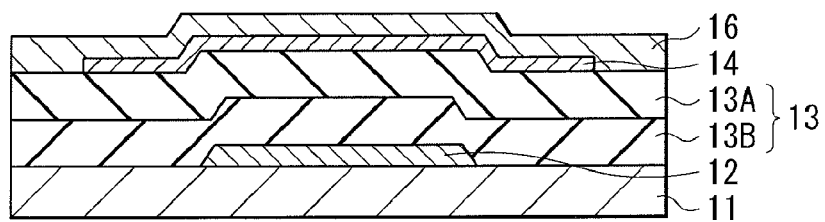
FIGS. 3A to 3C are diagrams illustrating processes subsequent to FIGS. 2A to 2C.

Subsequently, as illustrated in FIG. 3A, the channel protection film 16 containing fluorine is deposited by, for example, plasma CVD on the oxide semiconductor layer 14 formed. In this case, as a material gas, a mixed gas containing silane, dinitrogen monoxide, and carbon tetrafluoride (CF$_4$) is used. With the mixed gas, an insulating film containing fluorine, silicon, and oxygen is formed as the channel protection film 16. The fluorine concentration in the channel protection film 16 is controlled by changing the flow ratio of the material gas.

The material gas is not limited to the above-described gas. A mixture gas containing silicon tetrafluoride (SiF$_4$) and oxygen, a mixture gas containing tetraethoxysilane (TEOS), carbon tetrachloride (CCl$_4$), and oxygen, or the like may be used. With any of the mixture gas, an insulating film containing fluorine, silicon, and oxygen is formed as the channel protection film 16.

Figure 3B:
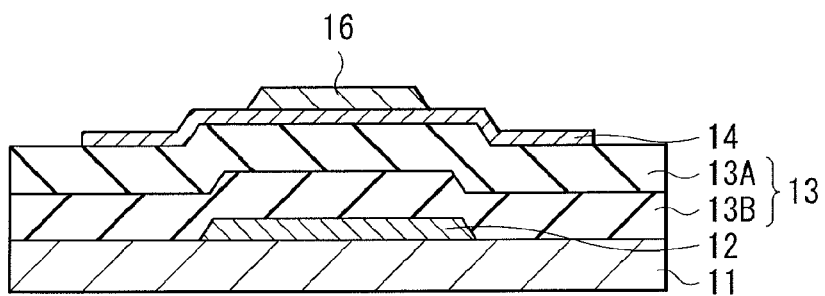

As illustrated in FIG. 3B, the formed channel protection film 16 is patterned in a desired shape by using, for example, photolithography.

Figure 3C:
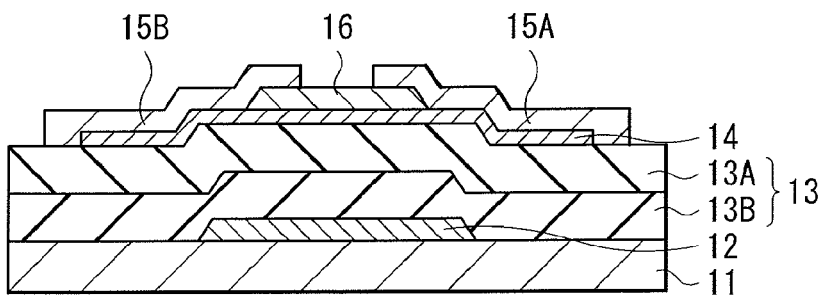

As illustrated in FIG. 3C, for example, a metal thin film obtained by stacking molybdenum, aluminum, and molybdenum is formed by, for example, sputtering in a region including the channel protection film 16 on the oxide semiconductor layer 14. After that, by wet etching using a mixture containing phosphoric acid, nitric acid, and acetic acid, the formed metal thin film is patterned. Since the surface (channel surface) of the oxide semiconductor layer 14 is protected by the channel protection film 16, the oxide semiconductor layer 14 is prevented from being damaged by the etching. In such a manner, the source/drain electrodes 15A and 15B are formed, respectively.

Subsequently, by forming the protection film 17 on the source/drain electrodes 15A and 15B by, for example, sputtering or ALD (Atomic Layer Deposition), the thin film transistor 1 shown in FIG. 1 is completed.

Action/Effect of Thin Film Transistor 1

The action and effect of the thin film transistor 1 of the embodiment will now be described.

In the thin film transistor 1, when the gate voltage equal to or higher than predetermined threshold voltage is applied to the gate electrode 12 via a not-shown wiring layer, a channel is formed in the oxide semiconductor layer 14, current (drain current) flows between the source/drain electrodes 15A and 15B, and the thin film transistor 1 functions as a transistor.

In the embodiment, the channel protection film 16 is provided on the oxide semiconductor layer 14 (on the source/drain electrode side), and the channel protection film 16 is formed by an insulating film containing fluorine. Since fluorine attracts charges (electrons), a negative fixed charge is formed in the channel protection film 16, and the channel protection film is negatively charged. Consequently, the threshold voltage of the thin film transistor 1 tends to shift to the positive direction.

In the manufacture process or the like, there is a case that oxygen in the oxide semiconductor layer 14 is detached and a lattice defect occurs. Also in such a case, since the channel protection film 16, which is in contact with the oxygen semiconductor layer 14, contains fluorine, the lattice defect is compensated by fluorine.

Further, since the channel protection film 16 forms parasitic capacitance between the gate electrode 12 and the source/drain electrodes 15A and 15B, desirably, relative permittivity of the channel protection film 16 is low. By using a silicon oxide film in which fluorine is introduced as the channel protection film 16 as in the embodiment, the relative permittivity becomes lower as compared with the case of using the silicon oxide film itself. Therefore, the embodiment also has an advantage that the parasitic capacitance between the electrodes is reduced.

As described above, in the embodiment, by making fluorine contained in the channel protection film 16 provided on the oxide semiconductor layer 14, the negative fixed charge is generated in the channel protection film 16 by the action of fluorine, and the threshold voltage is shifted to the positive direction. Even in the case where a lattice defect occurs due to desorption of oxygen or the like in the oxide semiconductor layer 14, the lattice defect is compensated by fluorine, so that it becomes easier to stably hold the electric characteristics in the oxide semiconductor. Therefore, in the thin film transistor 1 using the oxide semiconductor as a channel, the threshold voltage is controlled in a positive direction and reliability is increased.

EXAMPLE

Figure 4:
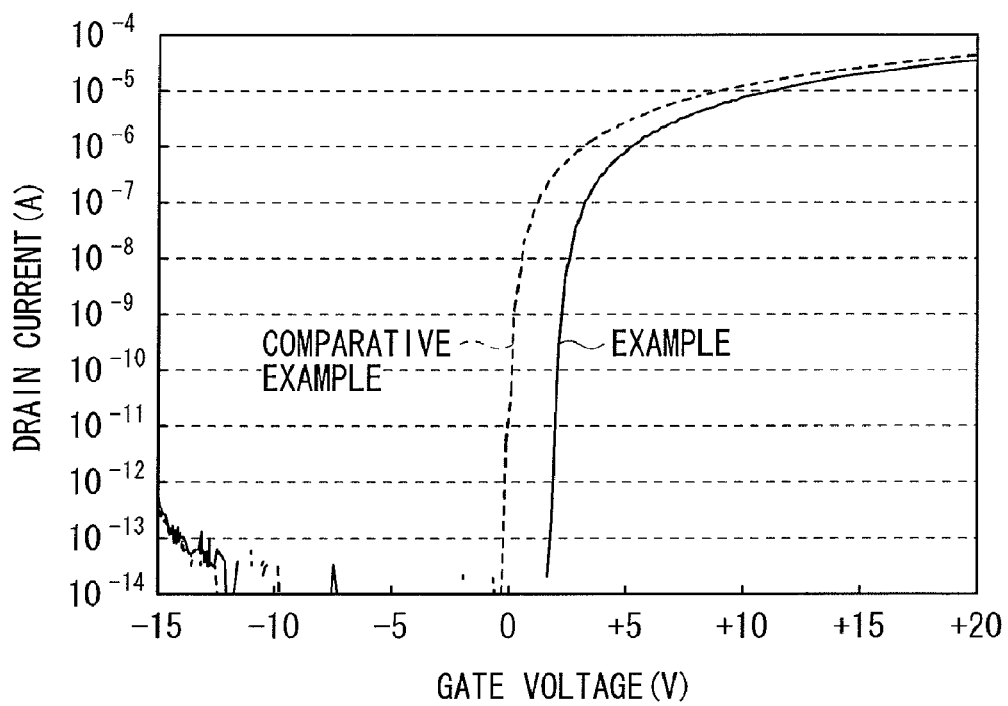
FIG. 4 is a characteristic diagram showing transmission characteristics of thin film transistors of an example and a comparative example.

As an example of the foregoing first embodiment, the transmission characteristic (the relation between the gate voltage and the drain current) of the TFT was measured, and a BT test (Bias-Temperature test) was conducted. The transmission characteristics of TFTs in the case where gas containing fluorine was used (example) as a material gas at the time of forming a channel protection film (silicon oxide film) by plasma CVD and those in the case where the gas was not used (comparative example) were measured. FIG. 4 illustrates the results of the measurement. The material gas was adjusted so that the fluorine concentration in the channel protection film in the example becomes $1.0 \times 10^{20}$ atom/cm$^3$. It is understood that the transmission characteristic of the TFT shifts to the positive direction by about 2V in the example using the channel protection film formed by using the gas containing fluorine as compared with the comparative example using the channel protection film containing no fluorine. The transmission characteristic is controllable by adjusting the fluorine concentration in the channel protection film. Consequently, by increasing the fluorine concentration in the film by properly adjusting the flow rate or the like in the material gas, the transmission characteristic is shifted more to the positive direction. The reason is that fluorine attracts negative charges, and the channel protection film is negatively charged.

Figure 5:
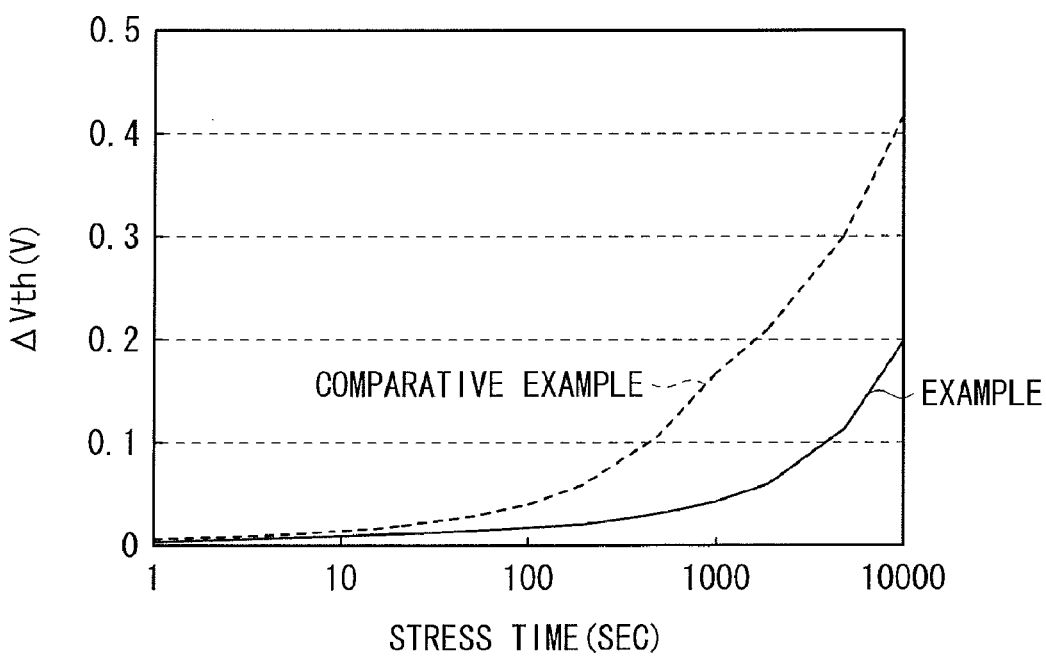
FIG. 5 is a diagram showing an example of a reliability test of the thin film transistors of the example and the comparative example.

FIG. 5 illustrates a result of a BT test on TFTs in the case where gas containing fluorine was used (example) as a material gas at the time of forming a channel protection film (silicon oxide film) by PCVD and that in the case where the gas was not used (comparative example) were measured. As the parameters in the BT test, temperature was set to 50° C., each of gate voltage and drain voltage as bias voltages was set to 15V, and stress time was set up to 10,000 seconds. It is understood from FIG. 5 that, in the example using the channel protection film containing fluorine, the value of ΔVth (a change amount in threshold voltage) after the BT test is reduced to the half or less of that of the comparative example using the channel protection film containing no fluorine. The reason is that a lattice defect in the oxide semiconductor layer 14 is compensated by fluorine.

It is understood from the results that since the channel protection film contains fluorine, the threshold voltage of the TFT is controlled to the positive direction, a change amount in the threshold voltage is suppressed, and the reliability of the TFT improves.

Next, thin film transistors according to modifications (first and second modifications) of the thin film transistor of the first embodiment (thin film transistors 2 and 3) will be described. The thin film transistors 2 and 3 are TFTs of the bottom gate type like the thin film transistor 1 of the first embodiment and use oxide semiconductor for a channel. In the following, the same reference numerals are designated to components similar to those of the thin film transistor 1 of the first embodiment and their description will not be repeated.

First Modification

Figure 6:
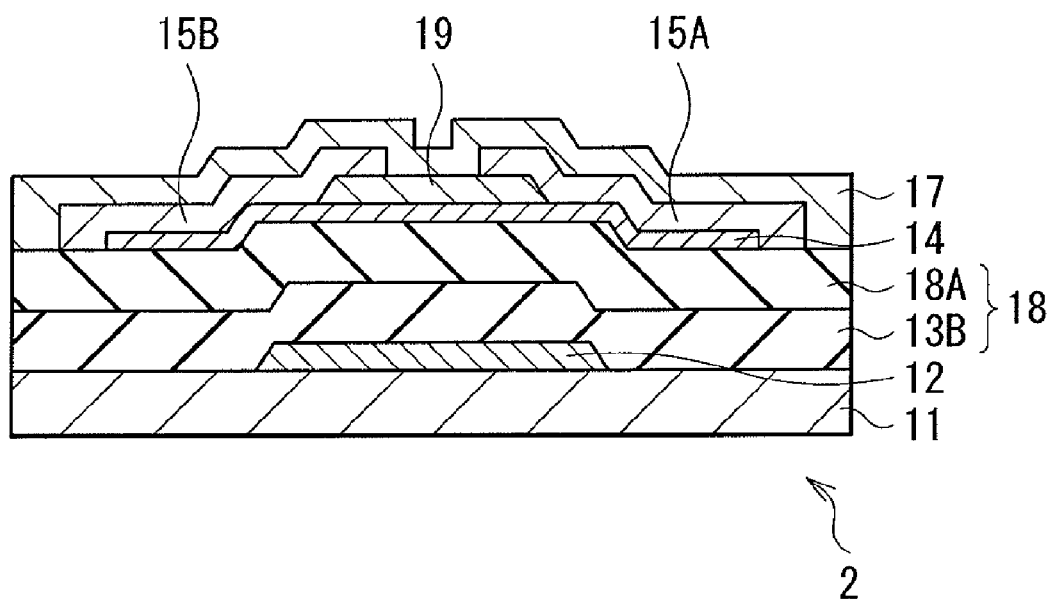
FIG. 6 illustrates a sectional structure of a thin film transistor as a first modification.

FIG. 6 illustrates a sectional structure of the thin film transistor 2 according to the first modification. In the thin film transistor 2, in a manner similar to the first embodiment, the gate electrode 12, a gate insulating film 18, the oxide semiconductor layer 14, a channel protection film 19, and the source/drain electrodes 15A and 15B are formed in this order on the substrate 11. The gate insulating film 18 is a stack film of, for example, a first insulating layer 18A and the second insulating layer 13B. Each of the first and second insulating layers 18A and 13B is a silicon oxide film, a silicon nitride film, a silicon nitride oxide film, or an oxide aluminum film. In this case, the first gate insulating layer 18A is, for example, a silicon oxide film, and the second insulating layer 13B is, for example, a silicon nitride film.

In the modification, the channel protection film 19 is a silicon oxide film containing no fluorine or the like, and the gate insulating film 18 is an insulating film containing fluorine. Specifically, the first insulating film 18A on t the oxide semiconductor layer 14 side in the stack film as the gate insulating film 18 contains fluorine, silicon, and oxygen. The first insulating layer 18A is formed in contact with the oxide semiconductor layer 14.

The gate insulating film 18 is formed, for example, as follows. First, in a manner similar to the first embodiment, the second insulating layer 13B made by, for example, a silicon nitride film is formed on the substrate 11 on which the gate electrode 12 is formed. After that, on the second insulting layer 13B formed, the first insulating layer 18A is formed by plasma CVD using a mixed gas containing silane, dinitrogen monoxide, and carbon tetrafluoride as a material gas. As a result, an insulating film containing fluoride, silicon, and oxygen is formed as the first insulating layer 18A. The fluorine concentration in the first insulating layer 18A is controlled by changing the flow rate of the material gas.

The material gas is not limited to the above-described gas. A mixture gas containing silane, silicon tetrafluoride, and oxygen, a mixture gas containing tetraethoxysilane, carbon tetrachloride, and oxygen, or the like may be used.

In the modification, by making fluorine contained in the gate insulating film 18 formed on the gate electrode 12 side of the oxide semiconductor layer 14, since the fluorine attracts negative charges, a negative fixed charge is generated in the gate insulating film 18, so that the threshold voltage tends to shift to the positive direction. Even in the case where a lattice defect occurs due to desorption of oxygen or the like in the oxide semiconductor layer 14, the lattice defect is compensated by fluorine, so that it becomes easier to stably hold the electric characteristics in the oxide semiconductor. Therefore, even in the case where the gate insulating film 18 provided on the gate electrode 12 side of the oxide semiconductor layer 14 contains fluorine, effects equivalent to that of the first embodiment are obtained.

When fluorine is introduced in the insulating film, the capacitance decreases. Consequently, in the case where fluorine is introduced in the gate insulating film 18 like the modification, it is desirable to introduce fluorine into only a necessary part, not the entire gate insulating film 18. That is, it is desirable to have a structure such that the gate insulating film 18 is a stack film, only the first insulating layer 18A on the oxide semiconductor layer 14 side (in this case, which is in contact with the oxide semiconductor layer 14) is allowed to contain fluorine, and the fluorine concentration in a portion closer to the oxide semiconductor layer 14 is higher. With the configuration, while suppressing decrease in the gate capacitance, the threshold voltage is shifted to the positive direction.

In the first embodiment and the first modification, the case where one of the channel protection film and the gate insulating film in the bottom-gate-type TFT contains fluorine has been described. However, both of the films may contain fluorine.

Second Modification

Figure 7:
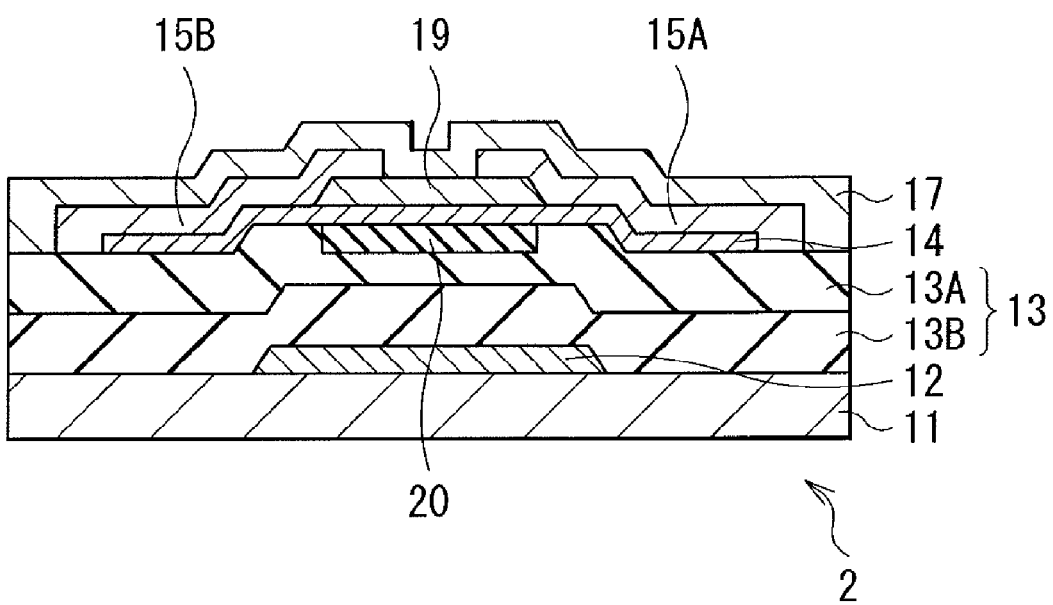
FIG. 7 illustrates a sectional structure of a thin film transistor as a second modification.

FIG. 7 illustrates a sectional structure of the thin film transistor 2 according to a second modification. In the thin film transistor 2, in a manner similar to the first embodiment, the gate electrode 12, the gate insulating film 13, the oxide semiconductor layer 14, the channel protection film 19, and the source/drain electrodes 15A and 15B are formed in this order on the substrate 11. The gate insulating film 13 has a two-layer structure of the first insulating layer 13A and the second insulating layer 13B.

In the modification, only a part of the first insulating layer 13A in the gate insulating film 13 contains fluorine. Specifically, a fluorine-doped layer 20 is buried so as to be opposed to the channel, on the face on the oxide semiconductor layer 14 side of the first insulating layer 13A. That is, in the first embodiment and the first modification, by using a fluorine-containing gas in a film forming process by plasma CVD of the channel protection film 19 and the first insulating layer 18A, fluorine is introduced in the films. In the modification, fluorine is introduced by the following procedure. For example, in a manner similar to the first embodiment, the second insulating layer 13B and the first insulating layer 13A are formed in this order on the gate electrode 12. After that, fluorine ions are doped in a predetermined region in the surface of the first insulating layer 13A by, for example, impurity diffusion or ion implantation. By properly adjusting the thickness of the first insulating layer 13A, dope energy, doping amount, and the like, the fluorine-doped layer 20 having desired depth and desired fluorine concentration is formed.

In the modification, the fluorine-doped layer 20 is formed on the face on the oxide semiconductor layer 14 side of the gate insulating film 13, so that a negative fixed charge is generated in the fluorine-doped layer 20, and the threshold voltage is shifted to the positive direction more easily. Even in the case where a lattice defect occurs due to desorption of oxygen or the like in the oxide semiconductor layer 14, the lattice defect is compensated by fluorine. Therefore, also in the case where fluorine is introduced to form the fluorine-doped layer 20 after formation of the gate insulating film 13, effects similar to those of the first embodiment are obtained.

As described above, to suppress decrease in the capacitance in the gate insulating film 13, preferably, the region in which fluorine is introduced is as small as possible. In the modification, after formation of the gate insulating film 13, fluorine is doped with necessary depth in a region closer to the channel. Consequently, different from the first modification, the fluorine-contained region is the minimum in the gate insulating film 13. Thus, decrease in the gate voltage is suppressed more effectively. Further, the gate insulating film 18 is not limited to the silicon oxide film, but an aluminum oxide film, a silicon nitride film, or the like may be also used.

Second Embodiment

Figure 8:
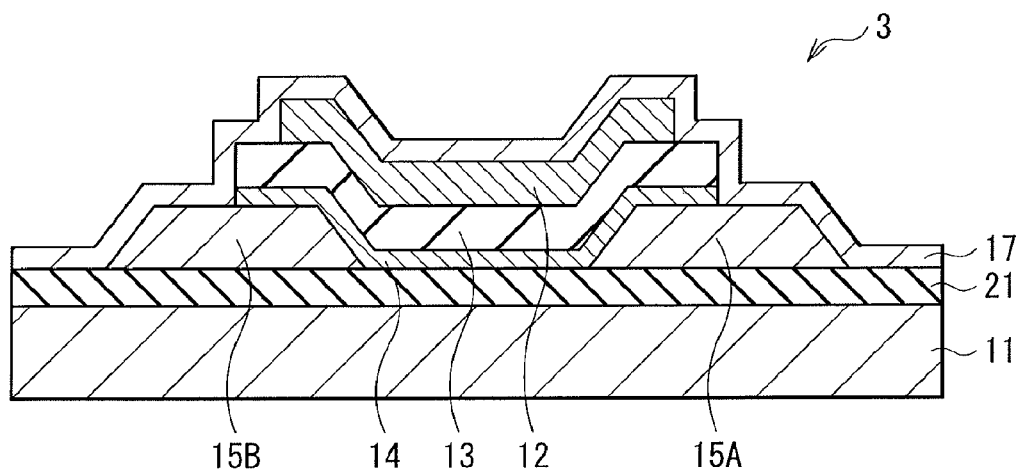
FIG. 8 illustrates a sectional structure of a thin film transistor according to a second embodiment of the invention.

FIG. 8 illustrates a sectional structure of the thin film transistor 3 according to a second embodiment of the present invention. The thin film transistor 3 is a so-called top-gate (staggered-structure) TFT, in which oxide semiconductor is used for a channel. In the thin film transistor 3, a base coat film 21, the source/drain electrodes 15A and 15B, the oxide semiconductor layer 14, the gate insulating film 13, and the gate electrode 12 are formed in this order on the substrate 11 made of glass or the like. On the gate electrode 12, the protection film 17 is formed on the entire face of the substrate 11. In the embodiment, although the layout of components is different from that of the bottom-gate-type TFT described in the first embodiment, the functions and materials of the components are similar to those of the first embodiment. Therefore, the same reference numerals are designated for convenience, and their description will not be repeated.

In the embodiment, the base coat film 21 formed on the substrate 11 is an insulating film containing fluorine and contains, for example, fluorine, silicon, and oxygen. The base coat film 21 is provided to prevent mix-in of impurity from the substrate 11 side, and is in contact with the oxide semiconductor layer 14 via an isolation trench between the source/drain electrodes 15A and 15B formed on the base coat film 21. That is, the base coat film 21 is formed in contact with the channel of the oxide semiconductor layer 14. The thickness of the base coat film 21 is, for example, 100 nm to 300 nm both inclusive.

Such a base coat film 21 is formed by plasma CVD using, as a material gas, a mixed gas containing silane, dinitrogen monoxide, and carbon tetrafluoride. The fluorine concentration in the base coat film 21 is controlled by changing the flow rate of the material gas.

The material gas is not limited to the above-described gas. A mixture gas containing silane, silicon tetrafluoride, and oxygen, a mixture gas containing tetraethoxysilane, carbon tetrachloride, and oxygen, or the like may be used.

In the embodiment, the base coat film 21, which is in contact with the channel of the oxide semiconductor layer 14, contains fluorine, so that a negative fixed charge is generated in the base coat film 21, and the threshold voltage is easily shifted to the positive direction. Even in the case where a lattice defect occurs due to desorption of oxygen or the like in the oxide semiconductor layer 14, the lattice defect is compensated by fluorine. Therefore, even in the case where the base coat film 21 formed on the substrate contains fluorine, effects equivalent to that of the first embodiment are obtained.

Third Modification

Figure 9:
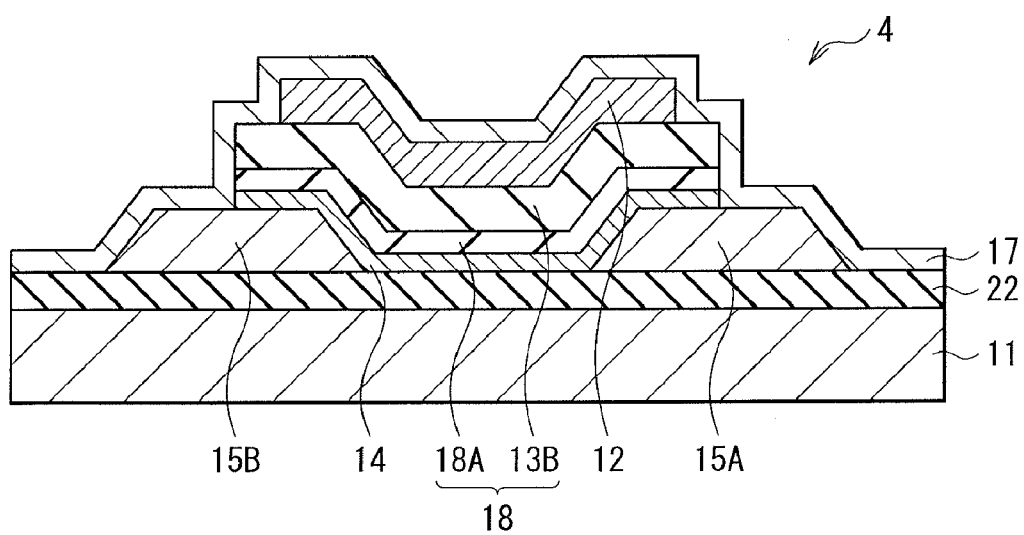
FIG. 9 illustrates a sectional structure of a thin film transistor according to a third modification.

FIG. 9 illustrates a sectional structure of a thin film transistor 4 according to a modification of the second embodiment (third modification). Also in the modification, although the layout of components is different from that of the bottom-gate-type TFT described in the first embodiment and the first modification, the functions and materials of the components are similar to those of the first embodiment and the first modification. Consequently, the same reference numerals are designated for convenience, and their description will not be repeated.

Like the thin film transistor 3 of the second embodiment, the thin film transistor 4 is a top-gate-type TFT in which oxide semiconductor is used for a channel. In the thin film transistor 4, a base coat film 22, the source/drain electrodes 15A and 15B, the oxide semiconductor layer 14, the gate insulating film 18, and the gate electrode 12 are formed in this order on the substrate 11. The gate insulating film 18 is, for example, a two-layer film made of the first insulating layer 18A and the second insulating layer 13B stacked in order from the oxide semiconductor layer 14 side. Each of the first and second insulating layers 18A and 13B is a silicon oxide film, a silicon nitride film, a silicon nitride oxide film, or an oxide aluminum film. In the modification, the first insulating layer 18A is, for example, a silicon oxide film, and the second insulating layer 13B is, for example, a silicon nitride film.

In the modification, the base coat film 22 is a silicon oxide film containing no fluorine, or the like, and the gate insulating film 18 is an insulating film containing fluorine. Specifically, the first insulating layer 18A on the oxide semiconductor layer 14 side in the stack film of the gate insulating film 18 contains fluorine, silicon, and oxygen. The first insulating layer 18A is formed in contact with the oxide semiconductor layer 14. The first insulating layer 18A may be formed by plasma CVD using mixture gas containing silane, dinitrogen monoxide, and carbon tetrafluoride. The fluorine concentration in the first insulating layer 18A is controlled by changing the flow rate of the material gas.

The material gas is not limited to the above-described gas. A mixture gas containing silane, silicon tetrafluoride, and oxygen, a mixture gas containing tetraethoxysilane, carbon tetrachloride, and oxygen, or the like may be used. With lowered process temperature, the base coat film 22 may be formed.

In the modification, the gate insulating film 18 formed on the gate electrode 12 side of the oxide semiconductor layer 14 contains fluorine, and the fluorine attracts negative charges. Consequently, a negative fixed charge is generated in the gate insulating film 18, so that the threshold voltage is more easily shifted to the positive direction. Even in the case where a lattice defect occurs due to desorption of oxygen or the like in the oxide semiconductor layer 14, the lattice defect is compensated by fluorine, so that it becomes easier to stably hold the electric characteristics in the oxide semiconductor. Therefore, also in the top-gate-type TFT, the gate insulating film 18 may contain fluorine. Also in such a case, effects equivalent to that of the first embodiment are obtained.

In a manner similar to the first modification, the gate insulating film 18 is a stack film, and only the first insulating layer 18A on the oxide semiconductor layer 14 side (in contact with the oxide semiconductor layer 14) contains fluorine. Consequently, the threshold voltage is shifted to a positive direction while suppressing decrease in the gate capacitance.

In the second embodiment and the third modification, the case where either the base coat film or the gate insulating film in the top-gate-type TFT contains fluorine has been described. However, both of the films may contain fluorine. Such a top-gate-type TFT may have a structure that, as described above in the second modification, a fluorine-doped layer is formed in the gate insulating film.

Application Examples

Next, application examples of the thin film transistors according to the first and second embodiments and the first to third modifications to a display device and an electronic device will be described below.

Display Device

Figure 10:
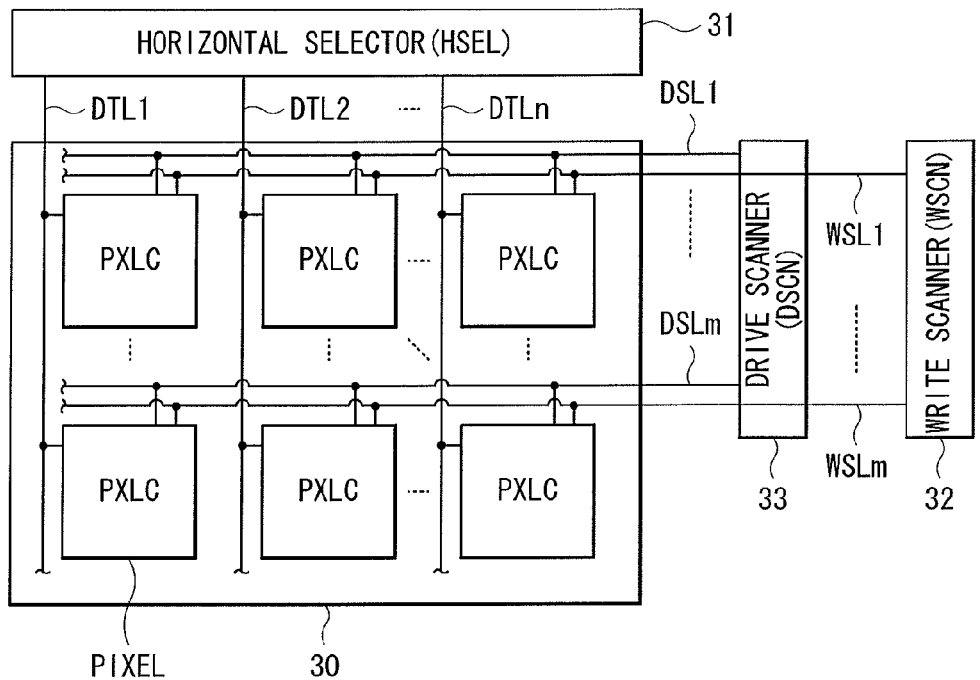
FIG. 10 is a block diagram illustrating a configuration example of a display device having a TFT according to the embodiments and modifications.

FIG. 10 illustrates a configuration example of a display device used as an organic EL display (a display device using an organic EL element). The display device has, for example, a display region 30 in which a plurality of pixels PXLC including an organic EL element (organic field-effect light emitting element) as a display element are disposed in matrix on a TFT substrate (the substrate 11). In the periphery of the display region 30, a horizontal selector (HSEL) 31 as a signal line drive circuit, a write scanner (WSCN) 32 as a scan line drive circuit, and a drive scanner (DSCN) 33 as a power supply line drive circuit are provided.

In the display region 30, a plurality of (integer "n" pieces of) signal lines DTL1 to DTLn are arranged in the column direction, and a plurality of scan lines WSL1 to WSLm and power supply lines DSL1 to DSLm are arranged in the row direction. A pixel PXLC (any one of pixels corresponding to red (R), green (G), and blue (B)) is provided at each of cross points of the signal lines DTL and the scan lines WSL. The signal lines DTL are connected to the horizontal selector 31, and a video signal is supplied from the horizontal selector 31 to the signal lines DTL. The scan lines WSL are connected to the write scanner 32, and a scan signal (selection pulse) is supplied from the write scanner 32 to the scan lines WSL. The power supply lines DSL are connected to the drive scanner 33, and a power supply signal (control pulse) is supplied from the drive scanner 33 to the power supply lines DSL.

Figure 11:
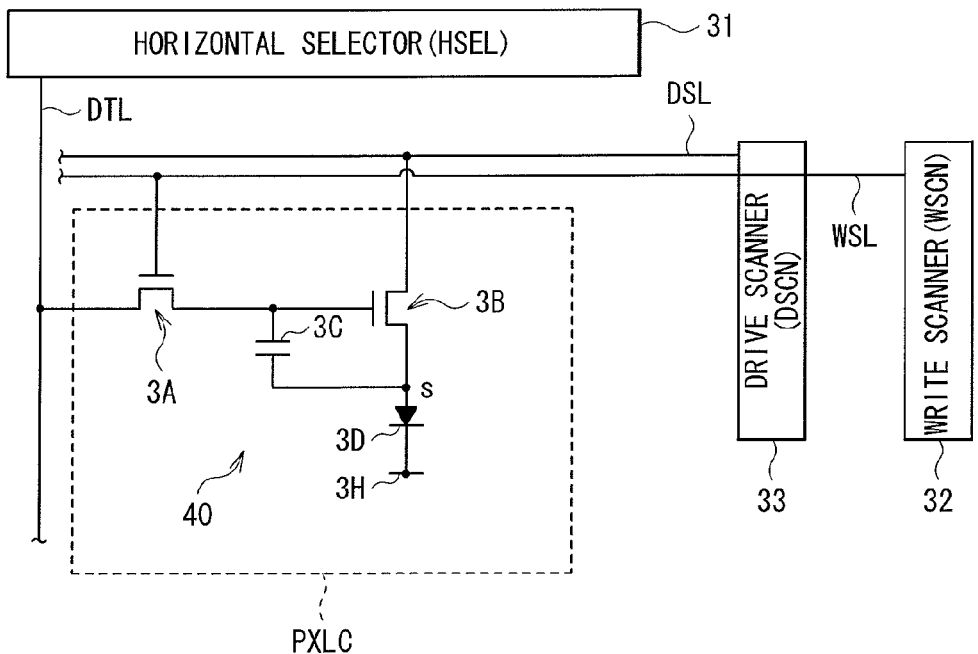
FIG. 11 is a circuit diagram illustrating a detailed configuration of a pixel shown in FIG. 10.

FIG. 11 illustrates a circuit configuration example of the pixel PXLC. Each of the pixels PXLC has a pixel circuit 40 including an organic EL element 3D. The pixel circuit 40 is an active-type drive circuit having a transistor 3A for sampling, a transistor 3B for driving, a retention capacitive element 3C, and an organic EL element 3D. The transistors 3A and 3B correspond to thin film transistors of the embodiment.

The gate of the transistor 3A for sampling is connected to the corresponding scan line WSL, one of the source and the drain is connected to the corresponding signal line DTL, and the other one of the source and the drain is connected to the gate of the transistor 3B for driving. The drain of the transistor 3B for driving is connected to the corresponding power supply line DSL, and the source is connected to the anode of the organic EL element 3D. The cathode of the organic EL element 3D is connected to a grounding line 3H. The grounding line 3H is disposed commonly to all of the pixels PXLC. The retention capacitive element 3C is disposed between the source and the gate of the transistor 3B for driving.

The transistor 3A for sampling is conducted according to a scan signal (selection pulse) supplied from the scan line WSL, thereby sampling the potential of a video signal supplied from the signal line DTL, and the sampled signal potential is held in the retention capacitive element 3C. The transistor 3B for driving receives current supplied from the power supply line DSL which is set to a predetermined first potential (not shown) and supplies drive current to the organic EL element 3D in accordance with the signal potential held in the retention capacitive element 3C. The organic EL element 3D emits light with luminance according to the signal potential of the video signal by the drive current supplied from the transistor 3B for driving.

In the display device, the transistor 3A for sampling is conducted according to a scan signal (selection pulse) supplied from the scan line WSL, thereby sampling the signal potential of the video signal supplied from the signal line DTL, and the sampled signal potential is held in the retention capacitive element 3C. The current is supplied from the power supply line DSL, which is set to the first potential, to the transistor 3B for driving, and the drive current is supplied to the organic EL element 3D (the organic EL element of red, green, or blue) in accordance with the signal potential held in the retention capacitive element 3C. The organic EL element 3D emits light with luminance according to the signal potential of the video signal by the supplied drive current. In such a manner, a video image based on the video signal is displayed in the display device.

Electronic Devices

In the following, examples of application of the display device to electronic devices will be described. The display device is applicable to electronic devices in all of fields such as a television apparatus, a digital camera, a notebook-sized personal computer, a portable terminal device such as a cellular phone, a video camera, and the like. In other words, the display device is applicable to electronic devices in all of fields, which display a video signal input from the outside or a video signal generated on the inside as an image or a video image.

Module

Figure 12:
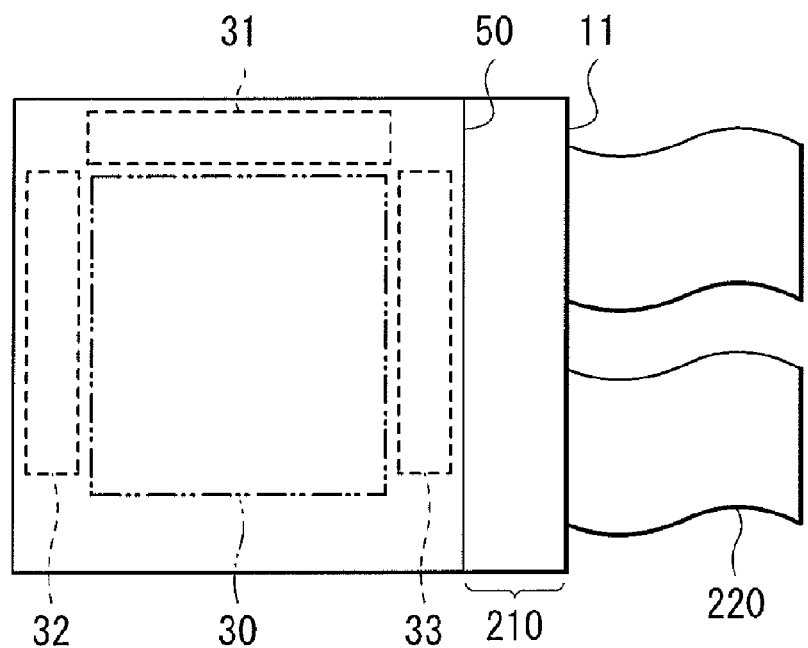
FIG. 12 is a plan view illustrating a schematic configuration of a module including the display device shown in FIG. 10.

The display device is assembled as, for example, a module as illustrated in FIG. 12, in various electronic devices such as application examples 1 to 5 which will be described later. The module is obtained by, for example, providing a region 210 exposed from a substrate 50 for sealing in one side of the substrate 11 and forming external connection terminals (not shown) by extending wires of the horizontal selector 31, the write scanner 32, and the drive scanner 33 in the exposed region 210. The external connection terminal may be provided with a flexible printed circuit (FPCs) 220 for inputting/outputting signals.

Application Example 1

Figure 13:
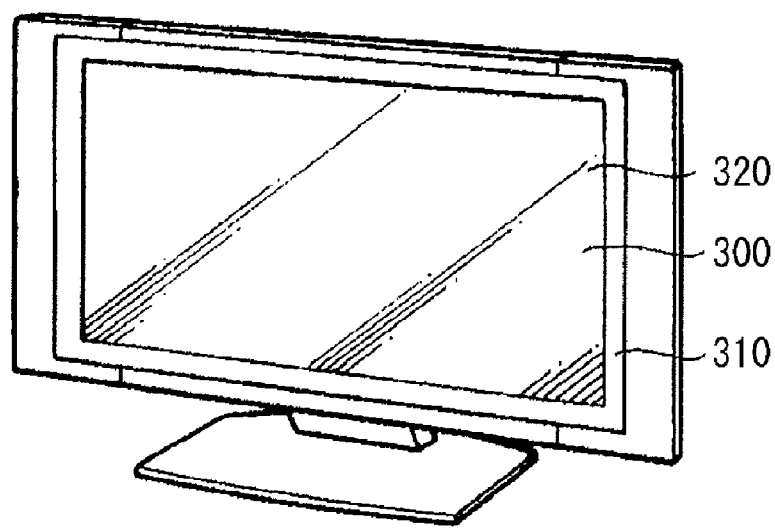
FIG. 13 is a perspective view illustrating the appearance of application example 1 of the display device shown in FIG. 10.

FIG. 13 illustrates the appearance of a television apparatus. The television apparatus has, for example, a video display screen unit 300 including a front panel 310 and a filter glass 320. The video display screen unit 300 corresponds to the display device.

Application Example 2

Figure 14A:
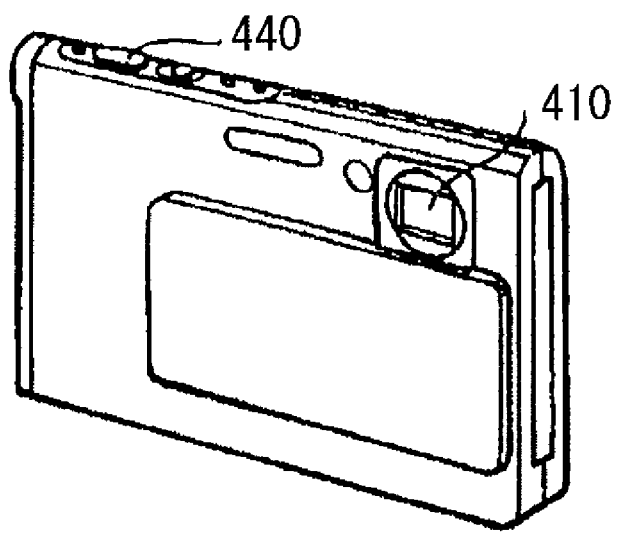
FIG. 14A is a perspective view illustrating the appearance seen from the surface side of application example 2.
Figure 14B:
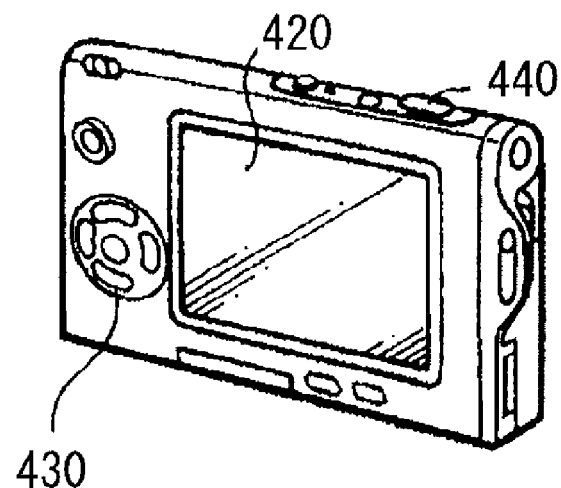
FIG. 14B is a perspective view illustrating the appearance seen from the back side.

FIGS. 14A and 14B illustrate the appearance of a digital camera. The digital camera has, for example, a light emitting unit 410 for flash, a display unit 420, a menu switch 430, and a shutter button 440. The display unit 420 corresponds to the display device.

Application Example 3

Figure 15:
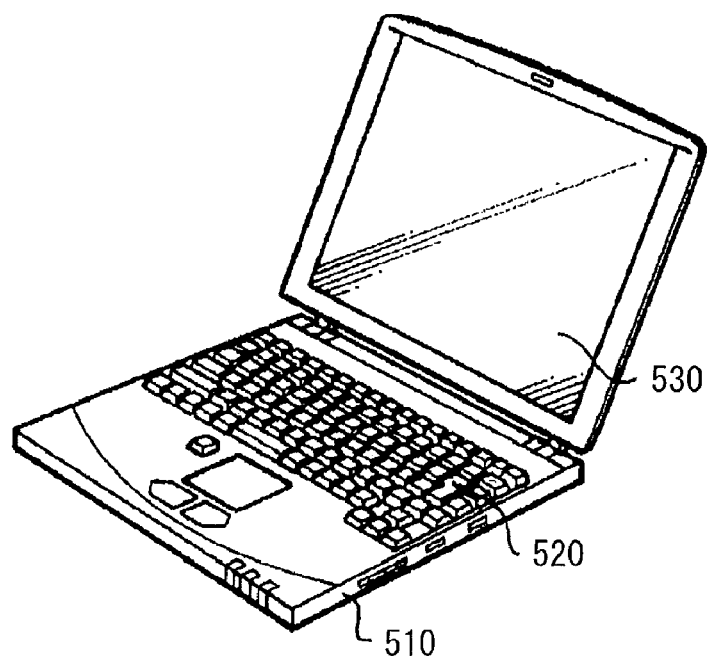
FIG. 15 is a perspective view illustrating the appearance of application example 3.

FIG. 15 illustrates the appearance of a notebook-sized personal computer. The notebook-sized personal computer has, for example, a body 510, a keyboard 520 for operation of inputting characters and the like, and a display unit 530 for displaying an image. The display unit 530 corresponds to the display device.

Application Example 4

Figure 16:
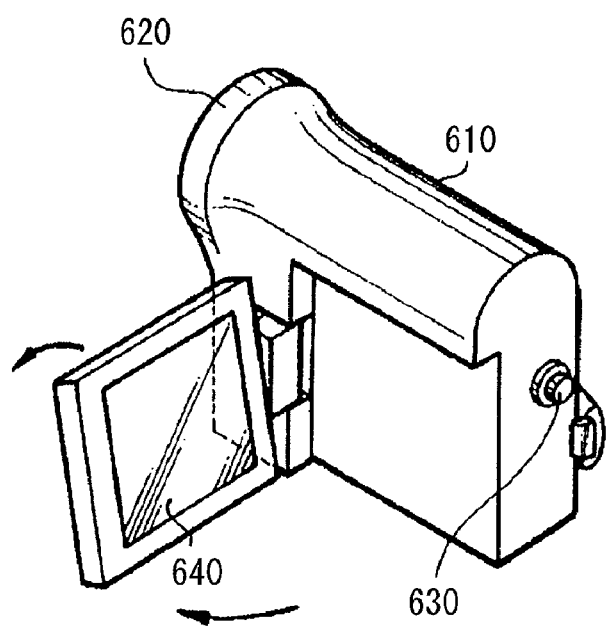
FIG. 16 is a perspective view illustrating the appearance of application example 4.

FIG. 16 illustrates the appearance of a video camera. The video camera has, for example, a body 610, a lens 620 for capturing a subject, which is provided in the front face of the body 610, a shooting start/stop switch 630, and a display unit 640. The display unit 640 corresponds to the display device.

Application Example 5

FIGS. 17A to 17G illustrate the appearance of a cellular phone. The cellular phone is constructed by, for example, coupling an upper casing 710 and a lower casing 720 by a coupling part (hinge) 730 and has a display 740, a sub-display 750, a picture light 760, and a camera 770. The display 740 or the sub-display 750 corresponds to the display device.

Although the present invention has been described above by the embodiments and the modifications, the present invention is not limited to the embodiments and the like but may be variously modified. For example, in the foregoing embodiments and the like, the case where the gate insulating film has a two-layer film of a silicon oxide film and a silicon nitride film has been described. However, the gate insulating film may have a single-layer structure, of a structure having three or more layers stacked. In any of the cases, it is desirable to introduce fluorine in a region or a layer on the side closer to the oxide semiconductor layer 14.

Although the case where the insulating film (the channel protection film or the gate insulating film) containing fluorine is in contact with the oxide semiconductor layer 14 has been described in the foregoing embodiments and the like, the insulating film does not have to be in contact. When the region containing fluorine exists near at least the oxide semiconductor layer 14, effects equivalent to that of the present invention are obtained.

Further, in the embodiments and the like, by using the fluorine-containing gas in the film forming process with the plasma CVD, fluorine is introduced in the channel protection film and the base coat film. As described in the second modification, after film formation, fluorine ions may be doped by ion implantation or the like.

The present application contains subject matter related to that disclosed in Japanese Priority Patent Application JP 2009-273801 filed in the Japanese Patent Office on Dec. 1, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A thin film transistor comprising:
    a gate electrode;
    a pair of source/drain electrodes;
    an oxide semiconductor layer provided between the gate electrode and the pair of source/drain electrodes and within which a channel is formed;
    a first insulating film as a gate insulating film provided on the gate electrode side of the oxide semiconductor layer; and
    a second insulating film provided as a protective film on the pair of source/drain electrodes side of the oxide semiconductor layer,
    wherein,
        at least one of the first insulating film the and second insulating film contains fluorine (F),
        the source/drain electrodes overlie the oxide semiconductor and respective sides of the second insulating layer, and
        the source/drain electrodes are each comprised of a three-layer structure in which an aluminum layer is sandwiched between two molybdenum layers.

2. The thin film transistor according to claim 1, wherein the first insulating film and/or the second insulating film contain/contains fluorine, silicon (Si), and oxygen (O).

3. The thin film transistor according to claim 1, wherein:
    at least the first insulating film contains fluorine, the first insulating film is obtained by stacking a plurality of insulating layers, and
    an insulating layer provided on the oxide semiconductor layer side in the plurality of insulating layers contains fluorine.

4. The thin film transistor according to claim 3, wherein the insulating layer on the oxide semiconductor layer side in the first insulating film contains fluorine, silicon (Si), and oxygen (O).

5. The thin film transistor according to claim 1, wherein the first insulating layer and/or the second insulating layer have/has a fluorine-doped layer in a region corresponding to at least the channel.

6. The thin film transistor according to claim 5, wherein each of the first and second insulating films has the fluorine-doped layer in a silicon oxide film, a silicon nitride film, or an aluminum oxide film.

7. The thin film transistor according to claim 1, wherein:
the gate electrode, the first insulating film, the oxide semiconductor layer, the second insulating film, and the pair of source/drain electrodes are provided in this order on a substrate, and
the second insulating film is a channel protection film.

8. The thin film transistor according to claim 1, wherein:
the source/drain electrodes are on a substrate in spaced apart relation;
the second insulating film is between and over the source/drain electrodes,
the first insulating film and gate electrode are provided in that order on the second insulating,
the second insulating film is a base coat film, and
the second insulating film is adjacent to and in direct contact with the oxide semiconductor layer within a space between the pair of source/drain electrodes.

9. The thin film transistor of claim 1, wherein the first insulating film comprises aluminum oxide.

10. The thin film transistor of claim 1, wherein each of the molybdenum layer of the electrodes is about 50 nm thick and the aluminum layer of the each of the source/drain electrodes is about 500 nm thick.

11. A display device comprising a display element and a thin film transistor for driving the display element,
wherein,
(1) the thin film transistor comprises
(a) a gate electrode;
(b) a pair of source/drain electrodes, each of which is comprised of a three-layer structure in which an aluminum layer is sandwiched between two molybdenum layers;
(c) an oxide semiconductor layer provided between the gate electrode and the pair of source/drain electrodes and forming a channel;
(d) a first insulating film as a gate insulating film provided on the gate electrode side of the oxide semiconductor layer; and
(e) a second insulating film provided on the pair of source/drain electrodes side of the oxide semiconductor layer,
(2) at least the second insulating film contains fluorine (F), and
(3) the second insulating film is adjacent the oxide semiconductor layer.

12. The display device of claim 11, wherein the first insulating film comprises aluminum oxide.

13. The display device of claim 11, wherein each of the molybdenum layer of the electrodes is about 50 nm thick and the aluminum layer of the each of the source/drain electrodes is about 500 nm thick.

14. Electronic device including a display device having a display element and a thin film transistor for driving the display element, the thin film transistor comprising:
a gate electrode;
a pair of source/drain electrodes, each of which is comprised of a three-layer structure in which an aluminum layer is sandwiched between two molybdenum layers;
an oxide semiconductor layer provided between the gate electrode and the pair of source/drain electrodes and within which a channel is formed;
a first insulating film as a gate insulating film provided on the gate electrode side of the oxide semiconductor layer; and
a second insulating film provided as a protective film on the pair of source/drain electrodes side of the oxide semiconductor layer,
wherein,
the first insulating film and/or the second insulating film contain/contains fluorine (F) ),
each of the first insulating film and the second insulating layer containing fluorine is adjacent to and in direct contact with the oxide semiconductor layer, and
the source/drain electrodes overlie the oxide semiconductor film and respective sides of the second insulation film.

15. The electronic apparatus of claim 14, wherein the first insulating film comprises aluminum oxide.

16. The electronic apparatus of claims 14, wherein each of the molybdenum layer of the electrodes is about 50 nm thick and the aluminum layer of the each of the source/drain electrodes is about 500 nm thick.

* * * * *